(12) United States Patent
Elleaume

(10) Patent No.: US 6,677,892 B1
(45) Date of Patent: Jan. 13, 2004

(54) PROCESS FOR THE PHASE AMPLITUDE DEMODULATION OF A RECEIVED RADAR SIGNAL AND DEVICE IMPLEMENTING SUCH A PROCESS

(75) Inventor: Philippe Elleaume, Antony (FR)

(73) Assignee: Thomson-CSF, Paris (FR)

( * ) Notice: Subject to any disclaimer, the term of this patent is extended or adjusted under 35 U.S.C. 154(b) by 1,826 days.

(21) Appl. No.: 06/825,488

(22) Filed: Jan. 7, 1986

(30) Foreign Application Priority Data

Jan. 8, 1985 (FR) .............................. 85 00185

(51) Int. Cl.⁷ .............................................. G01S 13/00
(52) U.S. Cl. ........................................................ 342/194
(58) Field of Search .............................. 342/194, 195, 342/197, 175; 329/126

(56) References Cited

U.S. PATENT DOCUMENTS

| | | | | |
|---|---|---|---|---|
| 3,235,867 A | * | 2/1966 | Wirth | 342/195 |
| 3,701,152 A | * | 10/1972 | Howard | 342/195 |
| 4,011,561 A | * | 3/1977 | Dounce | 342/195 |
| 4,044,352 A | * | 8/1977 | Wilmot | 342/197 |
| 4,074,264 A | * | 2/1978 | Wilmot | 342/197 |
| 4,532,515 A | * | 7/1985 | Cantrell et al. | 342/195 |

FOREIGN PATENT DOCUMENTS

| EP | 0 145 056 | 6/1985 |
|---|---|---|
| GB | 1113431 | 10/1964 |

* cited by examiner

*Primary Examiner*—Mark Hellner
(74) *Attorney, Agent, or Firm*—Oblon, Spivak, McClelland, Maier & Neustadt, P.C.

(57) ABSTRACT

The present invention relates to a process for the phase amplitude demodulation of a received radar signal and to an implementing device, the process consisting in sampling the intermediate frequency signal at a sampling frequency $f_e$ such that $f_e$ is equal to $\alpha B$, $\alpha$ being a number greater than or equal to 2 and B being the width of the pass-band, the intermediate frequency $f_i$ and the sampling frequency being in a ratio such that $f_i = (k \pm \frac{1}{4}) f_e$, k being an integer.

Application to coherent detection radars.

12 Claims, 4 Drawing Sheets

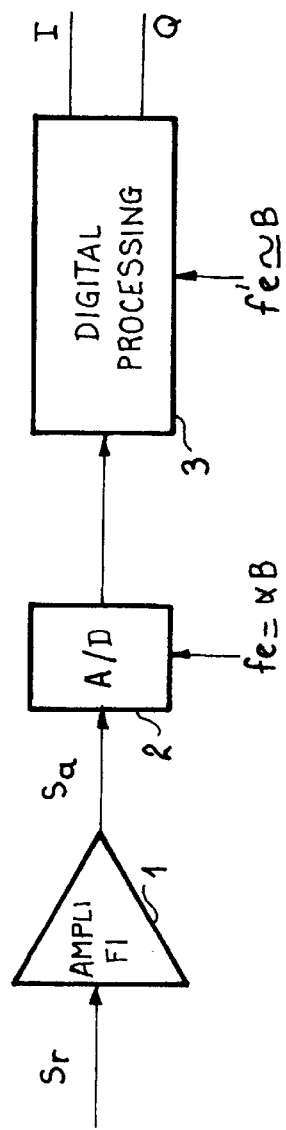
FIG_1
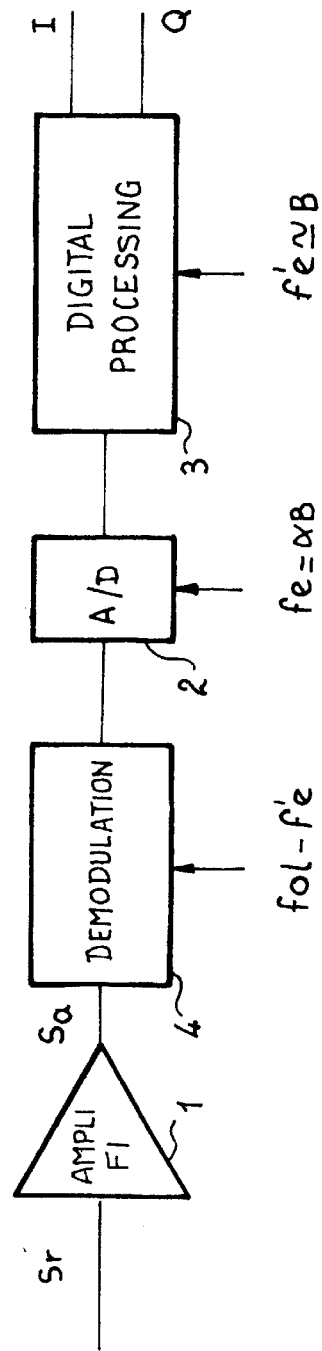
FIG_2

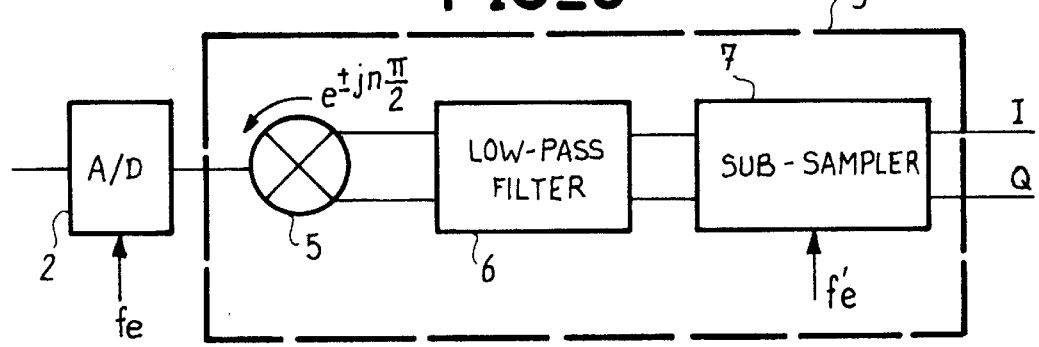
FIG_3
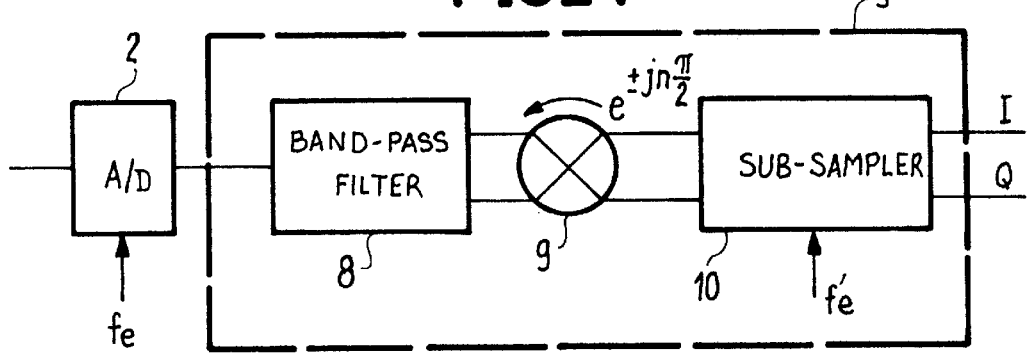
FIG_4
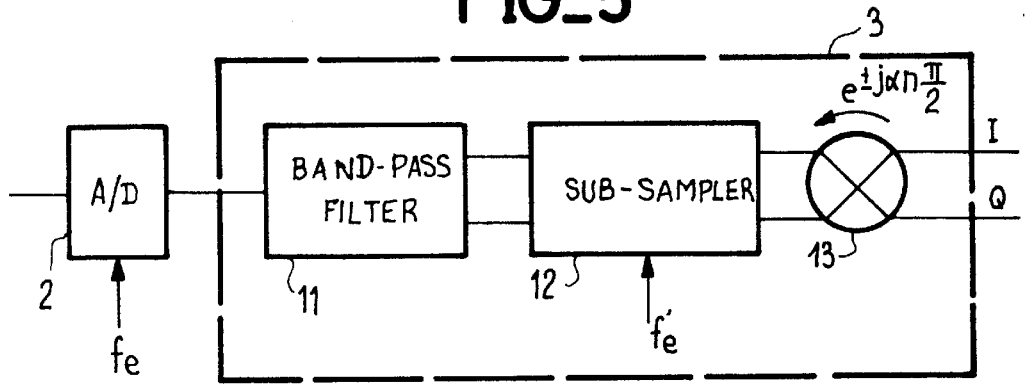
FIG_5
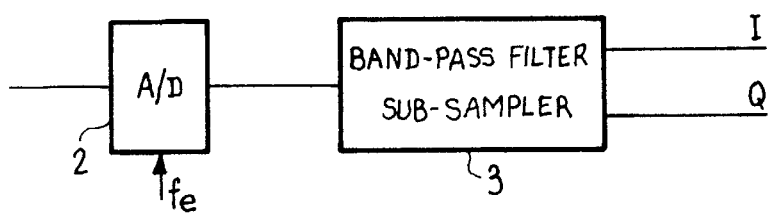
FIG_5-A

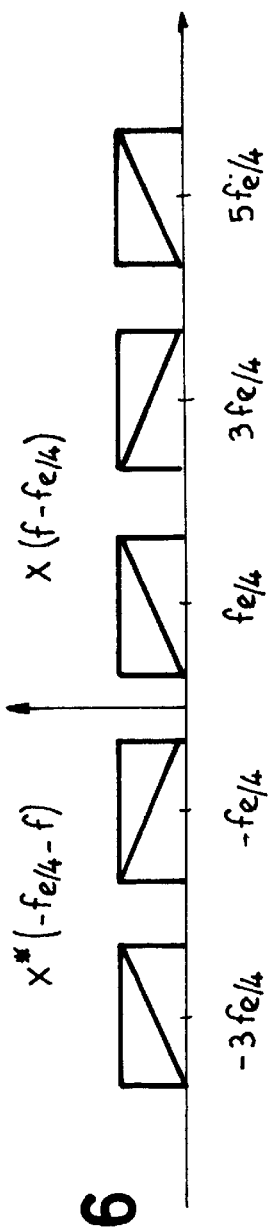
FIG_6
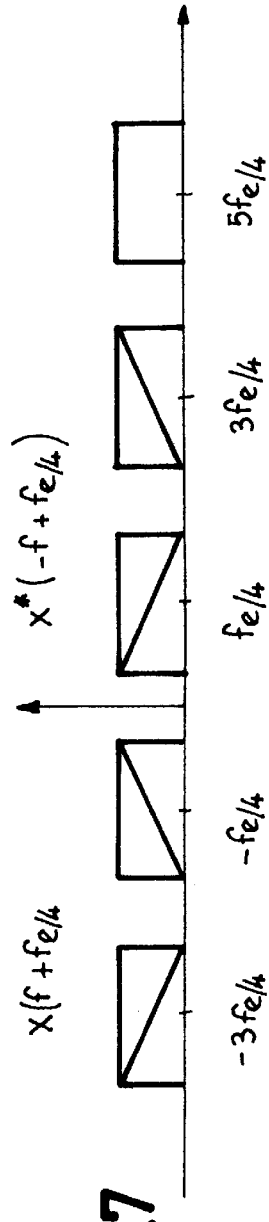
FIG_7
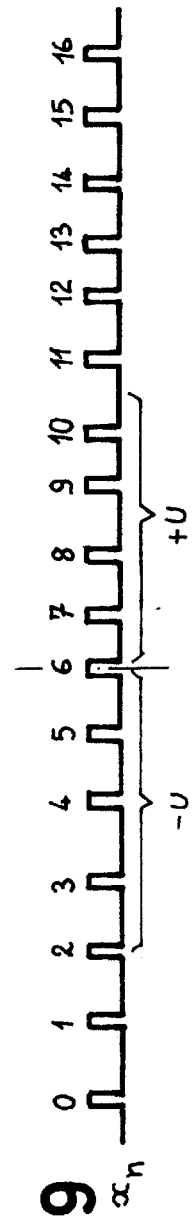
FIG_9

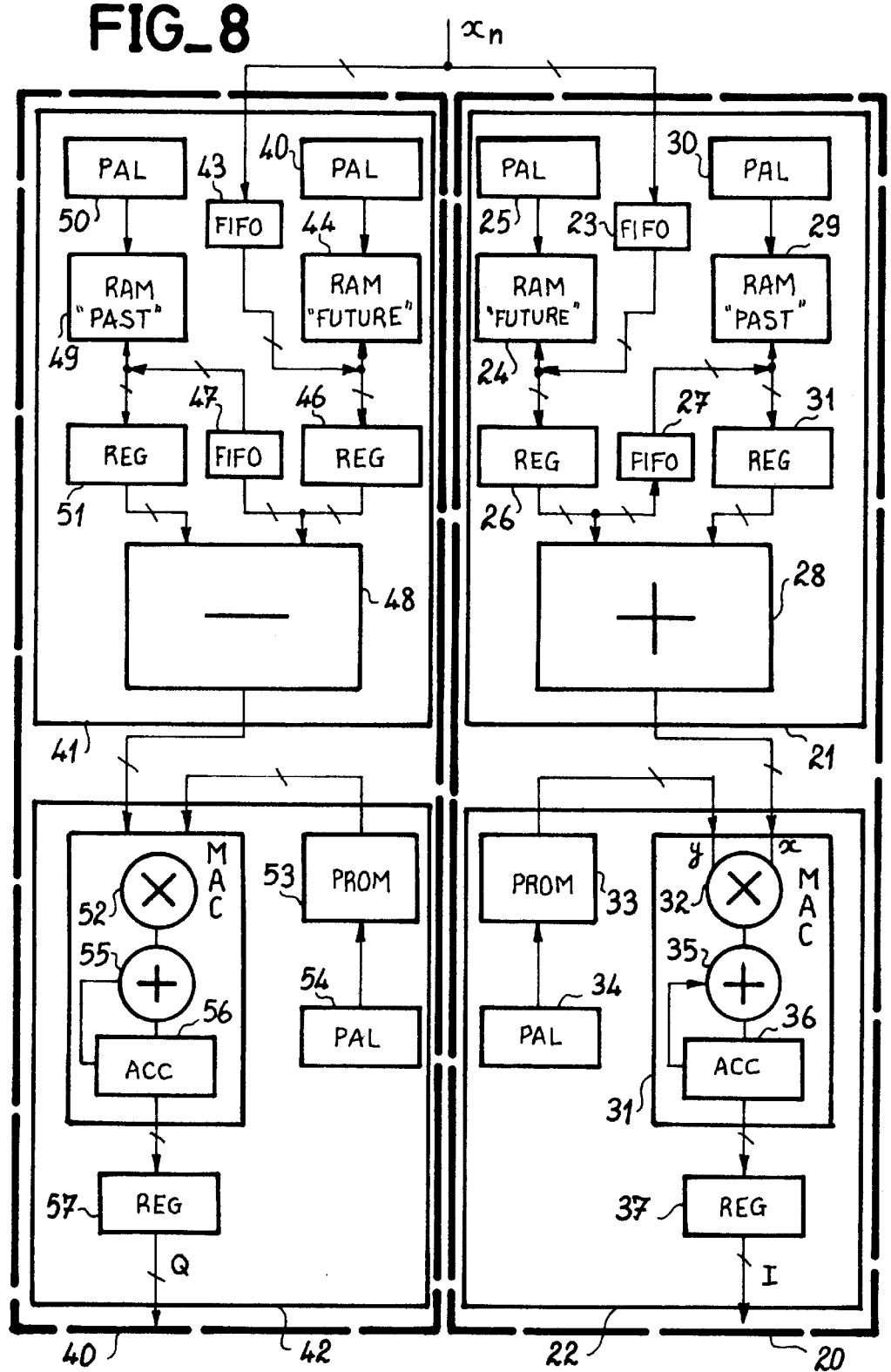
FIG_8

PROCESS FOR THE PHASE AMPLITUDE DEMODULATION OF A RECEIVED RADAR SIGNAL AND DEVICE IMPLEMENTING SUCH A PROCESS

BACKGROUND OF THE INVENTION

The present invention relates to devices for the phase amplitude demodulation of a received radar signal, this demodulation generally taking place after transposition of the UHF signal into intermediate frequency.

DESCRIPTION OF THE PRIOR ART

Traditionally, radars in which Doppler filtering or digital pulse compression is carried out necessitate the use of receivers including a coherent detection device. These devices which are also called demodulators give information on the amplitude and phase of the received signals. These coherent detection radar receivers therefore include, after an intermediate frequency amplifier, two phase amplitude detectors which work together in quadrature in order to carry out amplitude and phase demodulation. This demodulation consists in shifting the whole spectrum of the carrier frequency in order to bring one of the two spectra (real spectrum or image spectrum) into base band. Then, a low pass filtering is carried out in order to eliminate the image spectrum. These phase amplitude detectors are controlled by the output signal of a local reference oscillator at intermediate frequency. The video output signals are generally called I and Q.

Now, the two channels I and Q which come from the two phase amplitude detectors, are followed by two sampling and coding devices. A balance fault between these two channels I and Q can appear at the point of phase amplitude detection, which gives a slight unbalance in amplitude in these two channels and also a quadrature fault, in other words a phase shift slightly different from 90° from the local oscillator reference signal FI also gives a phase unbalance in the two channels I and Q.

These faults can be compensated for by adjustment loops associated with very powerful computation algorithms but despite everything they remain an element limiting the performance of radar signal processing devices. In particular they cause a rising of secondary lobes at the output of the Doppler filters which is undesirable. In the same way this rising of secondary lobes also appears in digital pulse compression devices whereas it is required to reduce the secondary lobes as much as possible.

Another solution solving this problem of balance consists in using devices for the automatic balancing of the gain and the quadrature of the video signals I and Q. A description of this solution can be found in the following articles: "Radar Conference 82" IEE Conference publication number 216 p.46. "Sacrifices in radar clutter suppression due to compromises in implementation of digital Doppler filter". I. W. TAYLOR; or IEE Trans. AES 17 p. 131 "the correction of I and Q errors in a coherent processor". The implemented devices are not however always simple and sometimes complicate the production of signal processing devices.

SUMMARY OF THE INVENTION

The present invention relates to a process for the phase amplitude demodulation of a received radar signal consisting in the direct sampling of the intermediate frequency $f_i$ received signal at a frequency of $f_e$ which is lower than that intermediate frequency.

In fact, one characteristic of the process consists in sampling the $f_i$ signal at a frequency $f_e$ equal to $\alpha B$, B corresponding to the reception pass band and $\alpha$ being a positive number greater than or equal to 2.

Another characteristic of the invention consists in then carrying out a sub-sampling at a frequency $f'_e$ such that $f'_e$ is approximately equal to B, before or after having brought the signal into baseband by demodulation.

The present invention also relates to a radar receiver implementing the process, which according to a first embodiment includes an intermediate frequency amplifier followed by an analog-digital converter, this converter being followed by a digital processing circuit.

The present invention also relates to a radar receiver implementing the process, which according to a second embodiment includes an intermediate frequency amplifier, a demodulator which brings the intermediate frequency signal to a frequency $f'_i$, such that $f'_i = f_{OL} - f_e$, $f_{OL}$ being the frequency of the local oscillator and $f'_e$ being the sub-sampling frequency, this demodulator being followed by an analog-digital converter.

Other characteristics and advantages of the present invention will clearly appear on reading the following description given by way of non-limiting example and with reference to the appended drawing in which:

FIG. 1 shows the general block diagram of a first embodiment of the device according to the invention;

FIG. 2 shows the general block diagram of a second embodiment of the device according to the invention;

FIG. 3 shows the basic block diagram of a first variant embodiment of the digital processing circuit;

FIG. 4 shows the basic block diagram of a second variant embodiment of the digital processing circuit;

FIG. 5 shows the basic block diagram of a third variant embodiment of this same circuit;

FIG. 5A shows a special case relating to FIG. 5;

FIGS. 6 and 7 show the spectra of the signal after sampling according to the first and second variant embodiments respectively;

FIG. 8 shows a particular embodiment of the digital processing circuit;

FIG. 9 shows a series of samples at frequency $f_e$ and at frequency $f'_e$.

DESCRIPTION OF PREFERRED EMBODIMENTS

The process according to the invention consists in sampling the received signal transposed into intermediate frequency. The sampling frequency $f_e$ is chosen equal to $\alpha$ times the reception pass band B, $\alpha$ being a number greater than or equal to 2. The process then consists in carrying out a digital processing in order to provide digital signals representing the amplitude and the phase of the received signal.

Elements having the same function for the purpose of the same result are given the same references.

The general block diagram of the device implementing the process according to the invention is shown in FIG. 1. It is a first embodiment wherein the device includes an intermediate frequency amplifier 1, an analog-digital converter 2, and a digital processing circuit 3. The amplifier 1 receives the radar signal $S_r$ transposed into intermediate frequency and amplifies it. The amplified signal $S_a$ is sampled by the converter 2 at a frequency of $f_e$ equal to $\alpha B$, the sampled signal then being processed by circuit 3. This processing consists in particular in carrying out a sub-sampling at a frequency $f'_e$ such that $f'_e$ is approximately equal to B.

FIG. 2 shows a second embodiment wherein the amplified intermediate frequency signal is demodulated by a demodulator 4 by a signal at intermediate frequency $f'_i$ such that $f'_i$ is equal to $f_{OL}-f_e/4$, $f_{OL}$ being the frequency of the receiver's local oscillator. The signal coming from the demodulator 4 is sampled at frequency $f_e$, $f_e=\alpha B$. The sampled signal is processed by the processing circuit 3.

FIGS. 3, 4 and 5 show the basic block diagrams of the processing circuit according to three variant embodiments.

According to the first variant the circuit 3 includes firstly a demodulator 5 which brings the useful signal into baseband, i.e. shifts the spectrum of the signal by at least plus or minus $f_e/4 (\pm f_e/4)$. This circuit is followed by a low pass filter 6 which eliminates the conjugate image spectrum. The baseband signal is then sub-sampled at frequency $f'_e$ which is approximately equal to B.

In the second and third variants shown in FIGS. 4 and 5 respectively the order in which the demodulation and filtering operations are carried out is changed. The solutions proposed in these two variants are equivalent to the first one. In fact, in FIG. 4, a band-pass filter 8 filters the output signal of the converter 2. The filtered signal is then demodulated by the demodulator 9 and then sub-sampled at frequency $f'_e$ by circuit 10.

In FIG. 5, there is also a band-pass filter 11 following the coder 2, a sub-sampler 12 which sub-samples at frequency $f'_e$ the signal coming from the filter 11. The demodulator 13 demodulates the output signal of the sub-sampler.

The principle of the invention therefore consists in sampling the signal on a carrier. In order to do this it is necessary that the pass-band of the intermediate frequency is matched to the useful band of the signal in order not to reduce the signal to noise ratio.

The sampling frequency chosen must satisfy the Shanonn Niquist criterion and its ratio with the intermediate frequency of the signal must enable an acceptable separation of the two bands of the signal (real and image spectra).

By choosing a sampling frequency $f_e$ such that:

$$f_e = \alpha B$$

where $\alpha \geq 2$ and an intermediate frequency $f_i$ such that:

$$f_i = (k \pm \frac{1}{4})f_e$$

k being an integer, the two imposed conditions are satisfied.

It is also noted that the second condition ensures not only the separation of the two bands but also the balancing of the inter-band difference. This difference is therefore:

$$\frac{f_e - 2B}{2}$$

The choice between + or − corresponds with the two possible positions of the bands with respect to the origin. The signal on carrier $S_a$ (at the intermediate frequency) is expressed by a function of time t, namely y(t), this function y(t) having a Fourier transform Y(f) such that:

$$Y(f) = \frac{1}{2}\{X(f - f_i) + X^*(-f_i - f)\}$$

where X(f) represents the spectrum and X*(f) represents the image spectrum.

If $\delta_\tau(t)$ is the sampling function:

$$\delta_\tau(t) = \sum_{n=-\infty}^{+\infty} \delta(t - n\tau) \quad \tau = 1/f_e$$

The sampled signal is therefore equal to z(t), such that:

$$z(t)=y(t).$$

$$\delta_\tau(t),$$

or:

$$z(t) = \sum_{n=-\infty}^{+\infty} yn\,\delta(t - n\tau)$$

where yn=y(nτ).

The spectrum of the sampled signal z(t) is expressed by its Fourier transform which is:

$$Z(f) = f_e \sum_{n=-\infty}^{+\infty} y(f - nf_e)$$

In the case in which $f_i=(k-\frac{1}{4})f_e$ is chosen, the spectrum shown in FIG. 6 is obtained, namely:

$$Z(f) = \frac{1}{2}f_e \sum_{n=-\infty}^{+\infty} X(f - f_e/4 - nf_e) + X^*(-f - f_e/4 - nf_e)$$

The low pass filter will be passing between 0 and B/2 and attenuating between $f_e/2-B/2$ and $f_e/2+B/2$.

In the case in which $f_i=(k+\frac{1}{4})f_e$ is chosen, the spectrum shown in FIG. 7 is obtained, namely:

$$Z(f) = \frac{1}{2}f_e \sum^{+\infty} \{X^*(-f + f_e/4 - nf_e) + X(+f + f_e/4 + nf_e)\}$$

The band-pass filter will be passing between $f_e/4-B/2$ and $f_e/4+B/2$ and attenuating between $3f_e/4-B/2$ and $3f_e/4+B/2$.

The two solutions are of course equivalent. The processing after sampling therefore consists in restoring X(f) explicitly.

This processing therefore consists as has been described previously in bringing the useful signal into baseband, i.e. in shifting the spectrum by $\pm f_e/4$ according to whether $f_i=(k\pm\frac{1}{4})f_e$, in eliminating the image spectrum by means of a low-pass (or band-pass) filter and in sub-sampling in order to approach a sampling frequency that satisfies the Shanonn criterion ($f'_e \simeq B$).

In the case in which the demodulation is carried out before the sub-sampling as shown in FIGS. 3 and 4, the following operation is carried out on each sample $x_n$.

$$x'_n = x_n e^{\pm j2\pi \frac{f_e}{4} n\tau}, \tau = 1/f_e \text{ or: } x'_n = x_n e^{\pm jn\frac{\pi}{2}}$$

This demodulation consists in fact in multiplying the modulo p, p=0,1,2,3 samples by the states representing $$e^{\pm jn\frac{\pi}{2}},$$

i.e. 1, ±j, −1, ±j. If $x_0$, $x_1$, $x_2$ and $x_3$ are the first four successive samples, these samples will be respectively multiplied by 1, +j, −1, −j if $f_i=(k+¼)f_e$ or by (1, −j, −1, +j) if $f_1=(k-¼)f_e$.

The practical achievement of this operation is trivial for a specialist in the field as it is a matter of sign changes and exchanging of real and imaginary parts.

When the filtering takes place after the demodulation, $x_n$ is of course real (FIG. 3) and when the filtering takes place before the demodulation, $x_n$ is complex (FIG. 4).

In the case in which the demodulation is carried out after the sub-sampling as shown in FIG. 5, the following operation is carried out:

$$x'_n = x_n e^{\pm j2\pi n\frac{f_e}{4}\alpha\tau}$$

In the special case in which α=4 has been chosen, the demodulation disappears, circuit 3 carries out the band-pass filtering and the sub-sampling as shown in FIG. 5A.

In other cases the following operation is carried out:

$$x'_n = x_n^{e^{\pm j\alpha\frac{\pi}{2}}} e^{\pm jn\alpha\frac{\pi}{2}}$$

FIG. 8 shows a particular embodiment of the digital processing device 3 which corresponds with the case in which α=4, i.e. that of FIG. 5A. In this case the demodulation disappears. In addition the computing power that is used is reduced by a factor of 4 as only samples corresponding to the sub-sampling are computed.

Circuit 3 includes a processing circuit 20 which restores the real part of the signal, i.e the amplitude I. It also includes a processing circuit 40 which restores the imaginary part of the signal, i.e. the phase Q. Each of these two circuits carries out the filtering and the sub-sampling. The demodulation disappears as has been stated previously because of the particular choice of α.

The series of samples $x_n$, n=0,1 ... N, is received at the input of each of the circuits 20 and 40. These two circuits carry out a digital filtering and the sub-sampling.

If $y_n$ is the signal at the output of these circuits, the filtering and sub-sampling operation on the samples $x_n$ is obtained by carrying out the following operations:

$$y_n = \sum_{u=0}^{n-1} h_u \cdot x_{4n-u} \quad (1)$$

where $h_u$ represents the complex coefficients of the digital filter produced.

FIG. 9 shows a first line corresponding to a series of samples $x_n$, n=0, 1 ... N, and a second line corresponding to the series of samples at frequency $f_e$. It is noted that a sample $y_n$ corresponds with a sample $x_{4n}$. The filtering and sampling operation represented by equation (1) can be simplified by noting that if we consider u past samples and u future samples, the complex coefficient $h_{-n}$ to be applied for a given sample among the u past samples is equal to the conjugate of $h_n$, i.e $h^*$, to be applied to a future sample corresponding in time. The operation therefore consists in carrying out the following function:

$$y_n = \sum_{u=-N/2}^{u=+N/2} x_{4n-u} \cdot h_u \text{ or: } y_n = \sum_{u=-N/2}^{0} x_{4n-u} \cdot h_u + \sum_{u=0}^{+N/2} x_{4n-u} \cdot h_u$$

Where: $h_{-u}=h_u^*$

In order to make understanding simpler we shall take an example in which u=0, 1, 2, 3; $h_u=a_u+jb_u$ and $h_{-u}=h_u^*$ from which $h_{-u}=a_u-jb_u$ $y_n=x_{4n-3}(a_u-jb_u)+x_{4n+3}(a_u+jb_u)$ or:

$$y_n = \sum_{u=0}^{N/2} (x_{4n-u} + x_{4n+u})(a_u) + (x_{4n+u} - x_{4n-u})(b_u)$$

which for the previous example is:

$$y_n = (x_{4n-u} + x_{4n+u})\begin{pmatrix}a3\\a2\\a1\\a0\end{pmatrix} + j(x_{4n+u} - x_{4n-u})\begin{pmatrix}b3\\b2\\b1\\b0\end{pmatrix}$$

Circuit 21 performs the function $(x_{4n-u}+x_{4n+u})$ i.e. the summing of the samples considered as past and of the samples considered as future. Circuit 41 performs the function $(x_{4n+u}-x_{4n-u})$ i.e. the difference between those same samples.

Circuit 22 stores the 2u real elements, i.e. it will carry out the following operation:

$$\sum_{0}^{+N/2} (x_{4n-u} + x_{4n+u})(a_u)$$

Circuit 42 stores the 2u imaginary elements, i.e. it will carry out the following operation:

$$\sum_{0}^{+N/2} (x_{4n+u} + x_{4n-u})(b_u)$$

The output of circuit 22 delivers a digital signal corresponding to the amplitude of the received signal and the output of circuit 42 delivers a digital signal in quadrature corresponding to the phase of the received signal.

Circuit 21 advantageously includes a FIFO (first in, first out) stack 23 which receives successively the samples $x_n$, these samples are stored in a Random Access Memory (RAM) 24 which will form the memory containing the future samples (+u samples at a given time). A sequential circuit 25 for example of Programmable Logic network (PAL) type addresses the memory. These samples are put into a register 26 which stores them in order to transmit them to a stack 27 of First In, First Out (FIFO) type on the one hand and to an adder 28 on the other hand.

The stack 27 successively introduces the samples which were in the memory 24 in order to re-enter them in a random acces (RAM) memory 29. Memory 29 stores the "future" samples which become "past". A sequential circuit 30 addresses this memory 29. The data read from memory 29 are stored in a register 31 which restores them at one input of the adder 28 at the same time as register 26 restores the stored data to the other input of the adder. The adder 28 therefore successively receives at each input the future and past samples ($x_{4n-u}$ and $x_{4n+u}$) in order to add them and to successively deliver the resultant samples of the sum to the output.

Circuit 22 includes a multiplier accumulator circuit 31 (MAC). This circuit 31 includes a multiplier 32 which receives the output signal of adder 28 and the data stored in a Programmable Read Only memory (PROM) 33 in which the real coefficients $a_u$ of the filter are stored. This memory 33 is controlled by a PAL sequencer 34. The output of multiplier 32 is applied to an adder 35. This adder is associated with an accumulator 36 to carry out the sum of the $2u$ elements and deliver a sample which is stored in a register 37.

Circuit 41 is formed from circuits referenced 43 to 50. Circuits 43 to 47, 49 and 50 are identical to circuits 23 to 27, 29 and 30, i.e. they perform the same function for the purpose of the same result. Only circuit 48 differs since this is a subtractor which carries out the difference between the "future" samples and the "past" samples.

Circuit 42 is formed from circuits 51 to 57. Circuits 51 to 57 are identical to circuits 31 to 37, they perform the same function for the purpose of the same result. However, the Programmable Read Only Memory 53 does not contain the real coefficients of the filter but the complex coefficients $b_u$ of the filter. Register 57 delivers samples in quadrature with the output samples from register 37.

The present invention carries out a phase-amplitude demodulation of a signal on a carrier $f_i$ using a sampling frequency $f_e$ which can be very much lower than the carrier frequency since this frequency $f_e$ is equal to $\alpha B$, $\alpha=4$ in a preferred embodiment and B being in general very small with respect to $f_i$ (the ratio can vary from 1 to 50 for example).

What is claimed is:

1. A process for the phase amplitude demodulation of a received radar signal after transposition of that signal into an intermediate frequency $f_i$ comprising the steps of:
    sampling said signal at a sampling frequency $f_e$ such that $f_e=\alpha B$, where B is the width of the reception pass-band and $\alpha$ is a number greater than or equal to 2;
    demodulating the signal sampled at frequency $f_e$ in order to bring the useful signal into baseband;
    filtering the demodulated signal to eliminate the conjugate image spectrum; and
    sub-sampling at a frequency $f'_e$ such that $f'_e$ is approximately equal to B.

2. Process according to claim 1, in which the signal sampled at frequency $f_e$ is filtered, then demodulated and then sub-sampled at a frequency $f'_e$ approximately equal to B.

3. Process according to claim 1, in which the signal sampled at frequency $f_e$ is filtered then sub-sampled at a frequency $f'_e$ approximately equal to B and then demodulated.

4. Process according to claim 1, in which the intermediate frequency signal results from a first transposition of the Ultra High Frequency signal and then a demodulation of this signal at a frequency $f_i$ such that $f_i=f_{OL}-f_e/4$, where $f_{OL}$ is the frequency of the receiver's local oscillator.

5. Process according to claim 1, in which the sampling frequency $f_e$ and the intermediate frequency are in a ratio such that $f_i=(k\pm\frac{1}{4})f_e$, k being an integer.

6. Process according to claim 1, in which the demodulation consists in multiplying the modulo p samples respectively by p representative states corresponding to $(1, +j, -1, -j)$ if we have taken $f_i=(k+\frac{1}{4})f_e$ or $(1, -j, -1, +j)$ if we have taken $f_i=(k-\frac{1}{4})f_e$.

7. Process according to claim 3, in which the demodulation consists in carrying out the following operation on each sample $$x_n, x'_n e^{\pm j2\pi n \frac{f_e}{4}\alpha\tau},$$

where $\tau$ is equal to $1/f_e$.

8. Process according to claim 7, in which $\alpha=4$, which enables the demodulation operation to be suppressed.

9. A phase amplitude demodulation device, comprising:
    an $f_i$ amplifier;
    an analog-digital converter connected to the amplifier; and
    a digital processing circuit connected to the converter, the digital processing circuit including:
        a band-pass filter,
        a sub-sampler, and
        a demodulator,
    wherein frequency $f_e$ is equal to 4B and $f_i=(k\pm\frac{1}{4})f_e$, and
    wherein the band-pass filter and sub-sampler comprises:
        a first digital circuit which receives the samples $x_n$, and carries out the addition of terms having the same filtering coefficient,
        a second digital circuit connected to said first circuit, which carries out the digital filtering of these samples and delivers a digital signal I, at the sub-sampling rate $1/f'_e$, corresponding with the amplitude of the received signal,
        a third digital circuit which receives the samples $x_n$ carries out the subtraction of terms having the same filtering coefficient,
        a fourth digital circuit which carries out the digital filtering of these samples and delivers a digital signal Q in quadrature with the first signal and at the same rate $1/f'_e$.

10. A device according to claim 9, wherein the first and third circuits comprise respectively a first FIFO stack connected to said analog-digital converter,
    a first random access memory connected to the first FIFO,
    a first register connected to the first random access memory (RAM),
    a second FIFO stack connected to the first register,
    a second random access memory (RAM) connected to the second FIFO stack, and
    a second register connected to the second random access memory (RAM);
    wherein the first circuit further comprises an adder connected to the second respective register, and
    wherein the second circuit further comprises a substractor connected to the second respective register.

11. A device according to claim 9, wherein the second circuit comprises:
    a programmable read only memory (PROM),
    a multiplier-accumulator circuit connected to said PROM and to the first digital circuit, and
    a register connected to the multiplier-amplifier.

12. A device according to claim 9, wherein the fourth circuit comprises:
    a programmable read only memory (PROM),
    a multiplier-accumulator circuit connected to said PROM and to the third digital circuit, and
    a register connected to the multiplier-amplifier.

* * * * *

UNITED STATES PATENT AND TRADEMARK OFFICE
CERTIFICATE OF CORRECTION

PATENT NO. : 6,677,892 B1
DATED : January 13, 2004
INVENTOR(S) : Elleaume

It is certified that error appears in the above-identified patent and that said Letters Patent is hereby corrected as shown below:

<u>Title page,</u>
Item [*] Notice, delete "1,826" and insert -- 0 --.

Signed and Sealed this

Thirtieth Day of August, 2005

JON W. DUDAS
*Director of the United States Patent and Trademark Office*